United States Patent [19]

Rebeschini

[11] Patent Number: 4,716,319
[45] Date of Patent: Dec. 29, 1987

[54] SWITCHED CAPACITOR FILTER FOR LOW VOLTAGE APPLICATIONS

[75] Inventor: Michael E. Rebeschini, Hanover Park, Ill.

[73] Assignee: Motorola, Inc., Schaumburg, Ill.

[21] Appl. No.: 892,534

[22] Filed: Aug. 4, 1986

[51] Int. Cl.[4] .......................... H03K 5/00; H03F 1/02
[52] U.S. Cl. .................................. 307/520; 328/167; 330/9
[58] Field of Search ............... 328/167, 162; 330/9, 330/107; 307/520, 521, 579, 491, 269

[56] References Cited

U.S. PATENT DOCUMENTS

| | | | |
|---|---|---|---|
| 3,720,848 | 3/1973 | Schmidt, Jr. | 307/251 |
| 3,810,031 | 5/1974 | Poujois | 330/9 |
| 4,365,204 | 12/1982 | Haque | 328/127 |
| 4,393,351 | 7/1983 | Gregorian et al. | 328/127 |
| 4,403,195 | 9/1983 | Wurzburg | 330/9 |
| 4,442,529 | 4/1984 | Ahuja et al. | 375/34 |
| 4,473,761 | 9/1984 | Peterson | 307/579 |
| 4,555,668 | 11/1985 | Gregorian et al. | 330/9 |
| 4,565,971 | 1/1986 | Brookshire | 330/9 |
| 4,636,738 | 1/1987 | Westwick et al. | 330/9 |

OTHER PUBLICATIONS

Martin, "Improved Circuits for the Realization of Switched Cap. Filters", ISCAS, Jul. 1979, pp. 756-759.
Allstot et al., "Technological Design Considerations for Monolithic MOS Switched-Capacitor Filtering Systems", Proc. of the IEEE, vol. 71, No. 8, Aug. 1983, pp. 967-986.
Brodersen et al., "MOS Switched Capacitor Filters", Proc. of IEEE, vol. 67, No. 1, Jan. 1979, pp. 61-75.
Gregorian et al., "A Continuously Variable Slope Adaptive Delta Modulation Codec System", IEEE Journal of Solid-State Circuits, vol. SC-18, No. 6, Dec. 1983, pp. 692-700.

Primary Examiner—Stanley D. Miller
Assistant Examiner—Timothy P. Callahan
Attorney, Agent, or Firm—Douglas A. Boehm; Donald B. Southard; Charles L. Warren

[57] ABSTRACT

An improved switched capacitor circuit configuration is disclosed which exhibits improved low voltage supply operation and improved charge injection cancellation performance. In the preferred embodiment of a switched capacitor integrator, the improvement is realized by the particular configuration of a switched tub switch on the input, single N-channel devices at the summing junction, skewing the analog ground $V_{AG}$ downward, and delaying the clock signals to turn off the switches at the summing junction before the charge injection of the switched tub switch is realized.

9 Claims, 10 Drawing Figures

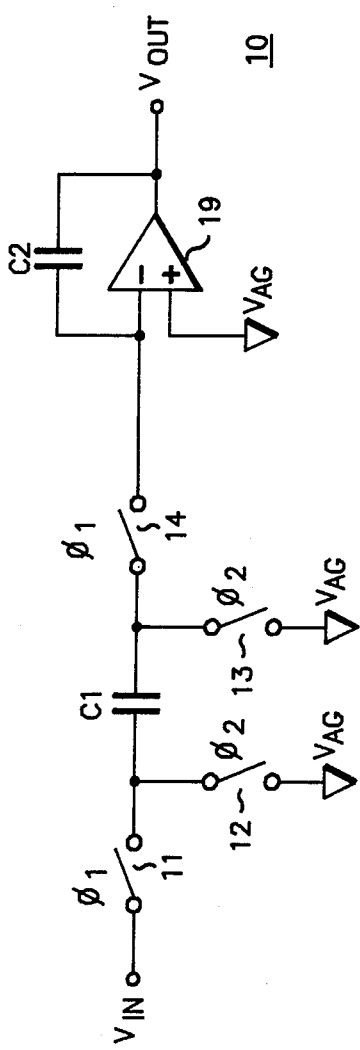
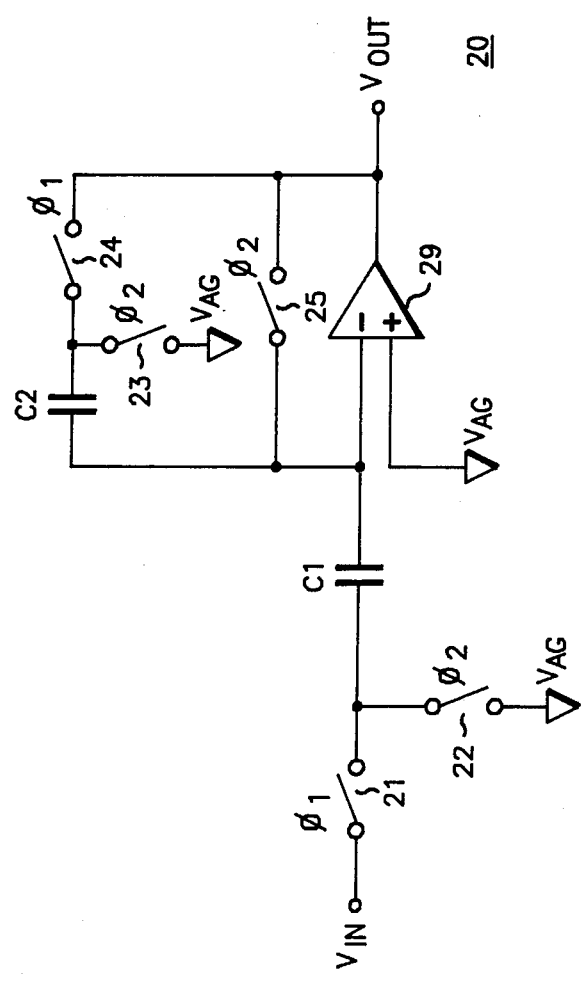

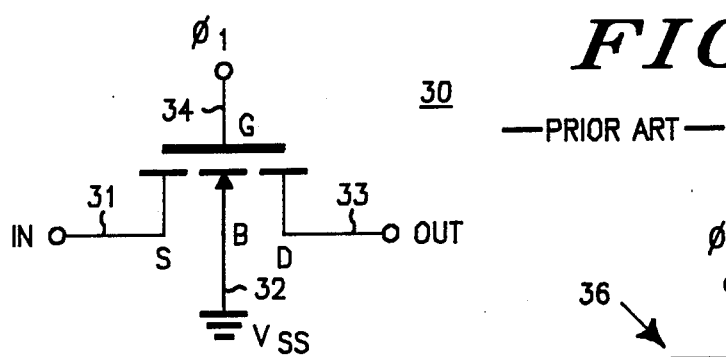
*FIG. 3A*
—PRIOR ART—
*FIG. 3B*
—PRIOR ART—
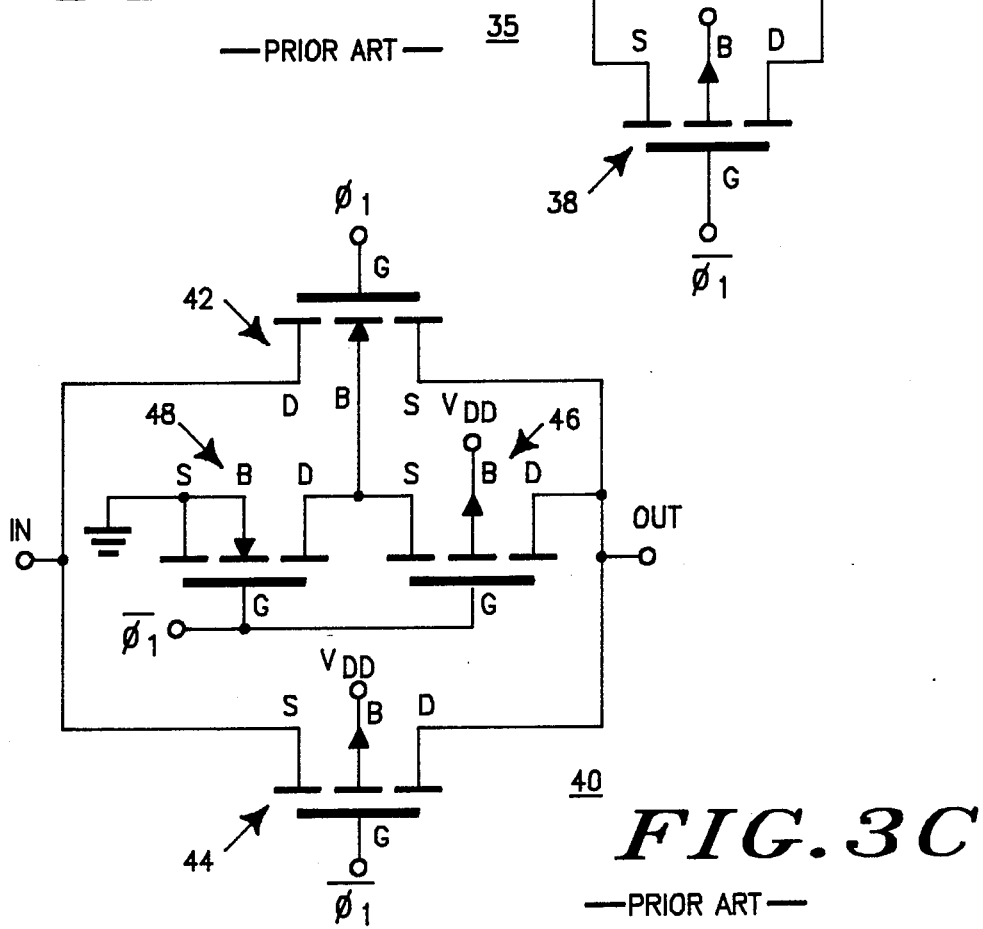
*FIG. 3C*
—PRIOR ART—

SWITCHED CAPACITOR FILTER FOR LOW VOLTAGE APPLICATIONS

BACKGROUND OF THE INVENTION

The present invention generally relates to MOS switched capacitor filtering systems and, more particularly, to an improved MOS switched capacitor circuit configuration which is particularly well adapted for use in low supply voltage applications.

Switched capacitor circuits utilize metal-oxide-semiconductor (MOS) transistors and capacitors to simulate the circuit behavior of a resistor. Switched capacitor filtering systems offer a significant improvement over conventional resistor-capacitor (RC) filters since the resistance values of integrated resistors are not highly controllable in MOS integrated circuit technology, whereas the ratio between MOS capacitors is reproducible accurate to within 0.1%.

A switched capacitor integrator circuit 10 is shown in FIG. 1 in accordance with the prior art. Operational amplifier 19, having its non-inverting terminal tied to analog ground voltage $V_{AG}$, is used in the inverting mode with capacitor C2 providing negative feedback from the op-amp output at $V_{OUT}$ to the op-amp inverting input. The switched capacitor C1 and its associated switches simulate the function of a series input resistor. When charging switches 11 and 14, controlled by clock signal $\phi_1$, and discharge switches 12 and 13, controlled by clock signal $\phi_2$, are alternately opened and closed at a clock rate $f_c$, then the switched capacitor circuit would give the same average current as a resistor having a value:

$$R = 1/C \cdot f_c$$

If the switch rate is much larger than the signal frequencies of interest, then the time sampling of the signal can be ignored, and the transfer function of the circuit would be:

$$V_{OUT} = \frac{-(f_c \cdot C1/C2) \cdot V_{IN}}{jw}$$

FIG. 2 illustrates an alternate switched capacitor circuit configuration, also known in the art. Auto-zeroed gain stage 20 is used to provide signal amplification while cancelling out the detrimental effect of the amplifier offset. Switches 22, 23, and 25 are closed during the $\phi_2$ clock cycle, and the offset present at the output of amplifier 29 is stored on capacitors C1 and C2. During the $\phi_1$ clock cycle, C1 is configured as an input capacitor (via closing switch 21) while C2 is configured as a feedback capacitor (via closing switch 24). Over a complete cycle of operation, the circuit exhibits a frequency dependent gain of $-C1/C2$ with excellent amplifier offset cancellation. Hence, switched capacitor circuits are not only limited to filtering applications.

In the circuit configuration of FIG. 2, gain device 29 may alternately be a comparator. In this case, capacitor C2 would be set equal to zero (open circuit) to provide an "infinite" gain. The circuit would then serve the function of comparing the input signal voltage $V_{IN}$ to the analog ground voltage $V_{AG}$. Numerous additional switched capacitor circuit configurations are possible to perform other circuit functions.

FIG. 3 illustrates the several alternative transmission gate configurations which may be used for the switches of FIGS. 1 and 2. FIG. 3A illustrates the first switch configuration 30, a single N-channel enhancement mode MOS transistor. An input signal to be switched is applied to source (S) terminal 31. The clock signal $\phi_1$ is applied to the gate (G) terminal 34. The output signal is then available at the the drain (D) terminal 33 when the switch is conducting (when $\phi_1$ is high). In this and the following descriptions of transmission gate configurations, the terms source and drain are interchangeable, since the MOS transistor is a bilaterally symmetrical device. Whether a terminal functions as a source or drain depends on the relative potential of the two terminals.

If the N-channel transistor is formed in an N-substrate, then a P-tub or P-well constitutes the bulk (B) terminal 32. Conversely, if the N-channel device is formed in a P-substrate, the P-substrate itself constitutes the bulk. It is standard practice to connect all the P-tubs in an N-substrate CMOS integrated circuit to the most negative voltage in the circuit. Hence, bulk terminal 32 is shown connected to ground, $V_{SS}$.

The operating characteristics of N-channel device 30 are shown in FIG. 4A by curve 52 labeled NMOS. The MOSFET's "on" resistance R is graphed versus the signal voltage $V_{SIG}$. It can be seen that the operating range of a single N-channel device is limited by the maximum allowable "on" resistance. The small-signal on resistance R, or resistance across the device, is a nonlinear function proportional to:

$$1/(V_{DD} - V_{SIG} - V_{Tn})$$

where $V_{SIG}$ is the input signal voltage, and $V_{Tn}$ is the N-channel device threshold. $V_{Tn}$ is a monotonically increasing function of $(V_{SIG} - V_{BULK})$. As the input signal voltage $V_{SIG}$ increases, the resistance curve 52 of the N-channel MOS device approaches an asymptote shown by vertical line 54 at the value of $V_{SIG}$ where the quantity $(V_{DD} - V_{SIG} - V_{Tn})$ equals zero. It can be seen from the graph that the high on resistance of a single NMOS device would prohibit a large voltage swing. To obtain a maximum signal swing, the analog ground voltage $V_{AG}$ is typically set at one-half of the supply voltage $V_{DD}$.

As one solution to this high on resistance problem, the prior art has utilized complementary MOS (CMOS) devices as shown in FIG. 3B. CMOS switch 35 is comprised of N-channel MOSFET 36 having its source (S) and drain (D) connected in parallel to the source and drain of P-channel MOSFET 38. Clock signals $\phi_1$ and $\overline{\phi_1}$, applied to the respective gate (G) terminals, are in phase but have opposite polarity. Hence, both transistors will be conducting at the same time.

Returning to FIG. 4A, N-channel transistor 36 exhibits resistance curve 52 (labeled NMOS), while P-channel transistor switch 38 exhibits the resistance curve 56 (labeled PMOS). The composite resistance characteristic of the CMOS device is derived from the parallel combination of the NMOS resistance (curve 52) and the PMOS resistance (curve 56). This CMOS switch arrangement results in an operating signal range extending from $V_{SS}$ to $V_{DD}$, provided that PMOS asymptote 58 occurs at a sufficiently lower voltage than NMOS asymptote 54 such that the maximum resistance of the CMOS switch is acceptable.

A further advantage of using CMOS devices is that the effect of parasitic charge injection caused when the N-channel device turns off is effectively cancelled by the corresponding charge injection caused when the P-channel turns off—if the devices are of the same size. In practice, however, this net charge cancellation is difficult to achieve without additional clocking circuitry and a corresponding decrease in operating speed. If both devices do not turn off at exactly the same time, the parasitic charge injected by the device turning off first will be swept through the device which is still on, and will still contribute to a net charge injection. Furthermore, the channel charge of a MOS device is a function of its threshold voltage as well as its size. It is well known that N-channel thresholds cannot be expected to have precisely the same absolute value as P-channel thresholds on a given wafer.

Referring now to FIG. 4B, the worst case resistance characteristics of CMOS transmission gate 35 of FIG. 3B is illustrated. The absolute value of the on resistance of a MOSFET can exhibit large variations with changes in temperature and process parameters, and the on resistance is not constant with changes in the applied signal voltage. Under worst case processing and temperature conditions, the on resistance of the switch can become excessively high or even infinite. This phenomenon is particularly apparent under low supply voltage conditions where the transistors operate under reduced gate-to-source drive. As the graph illustrates, the on resistance of the NMOS transistor follows curve 62 to approach asymptote 64. Similarly, the on resistance of the PMOS transistor follows curve 66 to approach asymptote 68. This worst case CMOS response results in a region of infinite switch resistance between the two asymptotes.

More specifically, the N-channel asymptote is given by the equation:

$$(V_{DD} - V_{SIG} - V_{Tn}) = 0$$

and the P-channel asymptote is given by the equation:

$$(V_{SIG} - V_{Tp}) = 0$$

where $V_{Tp}$, the corresponding P-channel device threshold, is a function of $(V_{BULKp} - V_{SIG})$. It should be noted that the N-channel asymptote decreases linearly with $V_{DD}$, while the P-channel asymptote decreases only as a function of the dependence of $V_{Tp}$ on $V_{DD}$. This dependence is less than first order, which indicates that the infinite resistance condition shown in FIG. 4B will occur for any CMOS transmission gate at a low enough value of $V_{DD}$. The particular value at which the condition occurs depends on the thresholds of the devices, which in turn depends on processing parameters and operating temperature. The infinite resistance condition generally occurs for values of $V_{SIG}$ near mid-supply, which is the most useful operating range of an analog circuit. A CMOS switch having the characteristics shown in FIG. 4B is essentially useless for most analog signal processing applications.

In an attempt to alleviate this problem, the "switched tub" transmission gate 40 shown in FIG. 3C was developed. N-channel transistor 42 and P-channel transistor 44 comprise the transmission gate switching transistors, and have their gates (G) coupled to inverse control signals $\phi_1$ and $\bar{\phi}_1$, respectively. Two additional transistors, P-channel MOSFET 46 and N-channel MOSFET 48, are coupled to the bulk (B) terminal of N-channel transistor 42 to switch the tub of the N-channel device either to ground potential or to the output potential. When control signal $\phi_1$ is high, transistors 42, 44, and 46 are conducting, such that the bulk of N-channel transistor 42 is connected to one side of the switch (the transmission gate output terminal in this case). When the bulk is connected to the same potential as the signal being switched, the threshold of the N-channel device is lowered, and the asymptote is shifted to a higher value of $V_{SIG}$. The extended operating range achieved by switching the tub of the N-channel device can be seen from FIG. 4C, which compares the resistance curves of a single N-channel device (curve 62) and a switched tub N-channel device (curve 72).

Although the switched tub switch exhibits an acceptable on resistance at low supply voltages, there are still several disadvantages regarding its use in switched capacitor circuits. First, switching the tub requires extra transistors which take up more room on the integrated circuit. Second, as noted by Petersen in U.S. Pat. No. 4,473,761, parasitic capacitances from the gate/drain and gate/source regions of MOS transistors produce a parasitic charge injection which is difficult to predict and cancel in switched tub switches.

A further problem, noted by Ahuja, et al., in U.S. Pat. No. 4,442,529, is that of noise susceptibility. Switched capacitor filter circuits typically have high-impedance summing node points which are particularly susceptible to power supply noise signals. In the integrator circuit of FIG. 1 and the gain stage circuit of FIG. 2, the critical summing junction is the inverting input terminal of the op-amps. Power supply noise can be capacitively coupled from the substrate to the switches which are connected to the high impedance inverting terminal of the op-amp (summing junction). If the switch is a MOS transistor built directly into the substrate (i.e., P-channel in an N-substrate), the coupling is between the source/drain of the transistor and the substrate. If the switch is a switched tub device, the coupling is between the substrate and the tub.

Power supply noise coupling into the high impedance nodes can be effectively eliminated by utilizing single transistor devices having their own isolated tubs—such as NMOS in a P-well process or PMOS in an N-well process—with the tubs hardwired to a clean supply. The tubs then function to shield the source/drain of the transistor from the substrate. The problem with this approach is that, with $V_{AG}$ set to one-half $V_{DD}$, the N-channel devices at the summing junction will not turn on under low supply voltage conditions (i.e., $V_{DD} = 5$ VDC or less, single-supply).

Therefore, a need exists for a switched capacitor circuit configuration adapted for use in low voltage applications which addresses the problems of switch charge injection, high on resistance, and noise susceptibility.

SUMMARY OF THE INVENTION

Accordingly, a principle object of the present invention is to provide an improved switched capacitor circuit configuration adapted for use in low voltage systems.

A more particular object of the present invention is to provide an improved switched capacitor filter circuit having low on resistance switches, low offset voltage, and large signal swing.

A further object of the present invention is to provide a switched capacitor circuit configuration which can be used as a basic building block for various switched capacitor circuits.

In accordance with the present invention, there is provided a unique switched capacitor circuit configuration using all N-channel switches and having: switched tub transmission gates for any input and output switches (switch 11 of FIG. 1 or switches 21 and 24 of FIG. 2); single transistor devices for any switches coupled to the summing junction (switches 13 and 14 or 25); a delayed clock signal to the switches on the input side of the switched capacitor (switches 11 and 12 or 21, 22, 23, and 24); and analog ground voltage $V_{AG}$ skewed downward to less than half of supply voltage $V_{DD}$. Additional improvements are realized by matching the switches at the summing junction (switches 13 and 14); by making the output driver of the gain device (op-amp 19 or 29) larger to swing closer to ground; and by adding a "dummy" (shorted drain-to-source) switch to the summing junction (switch 170 of FIG. 5).

In the preferred embodiment, a low voltage switched capacitor MOS integrated circuit is provided comprising: means for providing a reference voltage to a reference node, the reference voltage being less than one-half of the voltage at the supply node; an operational amplifier having an inverting input terminal, a non-inverting input terminal coupled to the reference node, and an output terminal coupled to the integrated circuit output node; a capacitor having first and second plates, the second plate coupled to the operational amplifier inverting input terminal; first means for switching, responsive to a first control signal, connected between the integrated circuit input node and the first capacitor plate, the first switch means being a switched tub N-channel MOS transistor; second means for switching, responsive to a second control signal, connected between the first capacitor plate and the reference node, the second switch means being a single N-channel MOS transistor; third means for switching, responsive to a third control signal, connected to the operational amplifier inverting input terminal, the third switch means being a single N-channel MOS transistor; and clock means for providing the control signals to each of the switch means, the first and second control signals being delayed in time with respect to the third control signal, whereby adverse switching characteristics of the first and second switch means do not affect the charge injection at the operational amplifier inverting input terminal.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

FIG. 1 is a basic circuit diagram of a switched capacitor integrator in accordance with the prior art;

FIG. 2 is a basic circuit diagram of a switched capacitor auto-zeroed gain stage in accordance with the prior art;

FIG. 3A is a schematic diagram of a single N-channel MOSFET switch;

FIG. 3B is a schematic diagram of a CMOS transmission gate;

FIG. 3C is a schematic diagram of a switched tub transmission gate in accordance with the prior art;

DESCRIPTION OF THE PREFERRED EMBODIMENT

Figure 5:
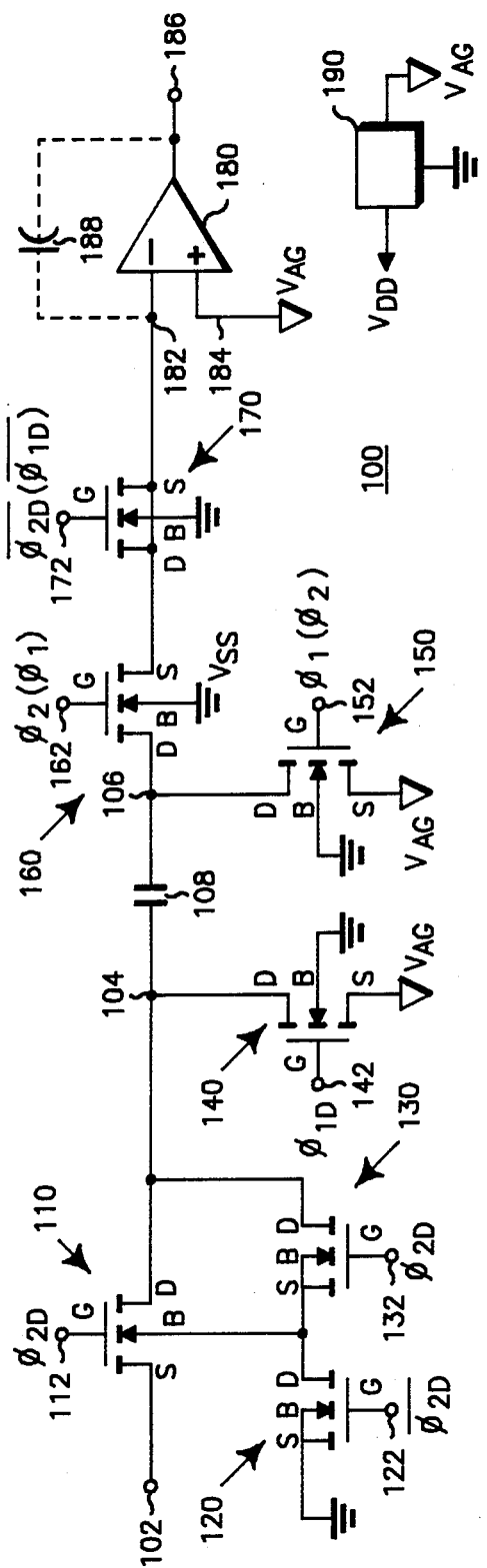
FIG. 5 is a schematic diagram of the preferred embodiment of the switched capacitor circuit configuration of the present invention.

Referring now to FIG. 5, the basic switched capacitor circuit configuration 100 is illustrated in accordance with the present invention. Switched capacitor circuit 100 represents a novel combination of switching topology, biasing voltages, and clocking signals which are particularly adapted for low voltage applications. Each aspect of the circuit will be individually described below.

1. N-channel Devices at the Summing Junction

Due to the delayed clocking scheme (described later in subheading no. 4), the only switches that contribute to switch charge injection are the switches connected to the summing junction of the op-amp (i.e., switches 150 and 160 of FIG. 5). If these switches are CMOS transmission gates, the inherent differences in the structure of P- and N-channel devices cannot be taken into account to produce a predictable charge injection. Similarly, the use of switched tub devices at the summing junction would make net charge cancellation very difficult. If, however, only single transistor switches are used at the summing junction, a predictable charge injection can be obtained since the devices are structurally identical. Furthermore, if the switches at the summing junction are matched, they can cancel each other's charge injected into the summing junction.

In the preferred embodiment, switches 150 and 160 are N-channel MOSFETs connected as shown. The gate terminal 152 of switch 150 is controlled by clock signal $\phi_1$, while the gate terminal 162 of switch 160 is controlled by clock signal $\phi_2$. During the time interval that $\phi_1$ is high, switch 150 is on (i.e., conducting current between its drain and source terminals). When $\phi_1$ goes low and switch 150 turns off, a fraction of the channel charge and gate capacitance associated with the transistor will flow into node 106. If the total charge associated with the transistor is Q, the charge injected into node 106 is $-kQ$, wherein the value k will depend upon the size of switching transistor 150, the fall time of the clock waveform $\phi_1$, and the value of capacitor 108. Since one side of switch 150 is connected to analog ground $V_{AG}$, k will have a value between 0 and 0.5. The k value becomes closer to 0.5 as the device is turned off more rapidly.

Switch transistor 160 turns on when clock waveform $\phi_2$ goes high. When this happens, switch 150 will inject a charge $+Q$ onto node 106 which is now connected to the summing junction 182 through transistor 160. (Disregard switch 170 for now.) Since a charge of $-kQ$ was left by switch 150 at node 106, a total charge of $(1-k)Q$ will be swept into capacitor 188 as the summing junction returns to analog ground through the feedback mechanism associated with op-amp 180.

When $\phi_2$ goes low, switch 160 turns off. The charge associated with switch 160 then divides itself between node 106 and summing junction 182. Since capacitor 188, in series with any load capacitance at op-amp output node 186, is usually large compared to the value of capacitor 108, the summing junction 182 appears as an analog ground. Hence, the charge from transistor 160 divides itself in the same manner as when transistor 150 turns off, with $-kQ$ being injected into node 106, and with $-(1-k)Q$ being injected into the summing junction. Thus, over a complete $\phi_1$ and $\phi_2$ cycle, the charge injected into the summing junction is 0. The technique of utilizing only single N-channel devices at the summing junction ensures that there is no net charge injection, and hence no switch-induced offset voltage.

To further smooth the output signal on the half cycles of the clock signals, compensation transistor 170 is added. Notice that compensation transistor 170 has its drain (D) and source (S) terminals shorted together, and that gate (G) terminal 172 is clocked by the inverse waveform that clocks transistor 160, specifically $\overline{\phi_2}$. Transistor 170 is designed such that its channel is one-half of the width of the channel dimension of transistor 160, such that it injects one-half of the charge into the summing junction to cancel the charge injection at the source of transistor 160. This "dummy switch" technique of cancelling instantaneous charge injection is known in the art.

The technique of utilizing only single, matched, N-channel devices at the summing junction results in a net charge injection cancellation over an entire clock cycle. The technique of utilizing dummy switch 170 results in an instantaneous charge injection cancellation for each half-cycle of the clock.

2. Analog Ground Voltage $V_{AG}$ Skewed Downward

Figure 4A:
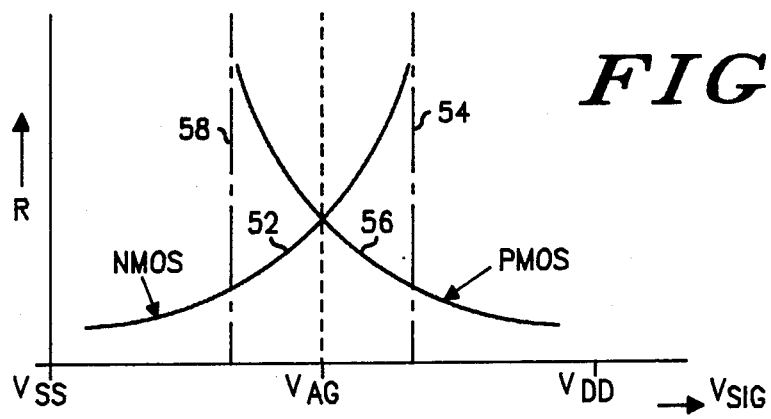
FIG. 4A is a graphic representation of the on resistance versus operating signal voltage for a CMOS switch.
Figure 4B:
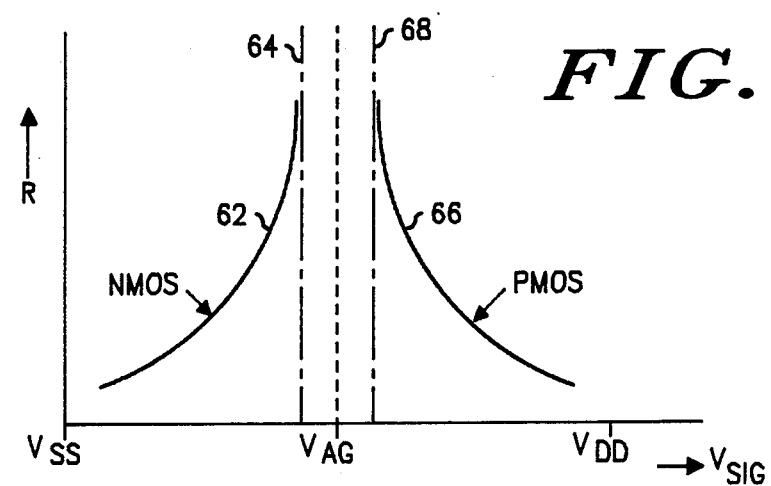
FIG. 4B is the corresponding graphic representation to FIG. 4A under low voltage and worst case temperature and processing conditions.

The switches in a switched capacitor network can be classified into two types: (I) switches which have one side permanently connected to analog ground or a virtual analog ground; and (II) switches which do not have one side connected to analog ground. Referring to the switch resistance curves in FIG. 4A, a type I switch would always operate with $V_{SIG}$ equal to $V_{AG}$ in equilibrium, whereas a type II switch must operate over a range:

$$V_{AG} - V_{max} < V_{SIG} < V_{AG} + V_{max}$$

where $V_{max}$ is the maximum allowable signal. In the standard switched capacitor circuit configuration, the analog ground voltage $V_{AG}$ is typically set to one-half of supply voltage $V_{DD}$. This usually maximizes the signal range over which the circuit will operate. If, under worst case conditions, the infinite resistance region around $V_{DD}/2$ (shown in FIG. 4B) occurs, then neither a CMOS transmission gate nor a single N-channel device is adequate for both type I and type II switches.

Figure 4C:
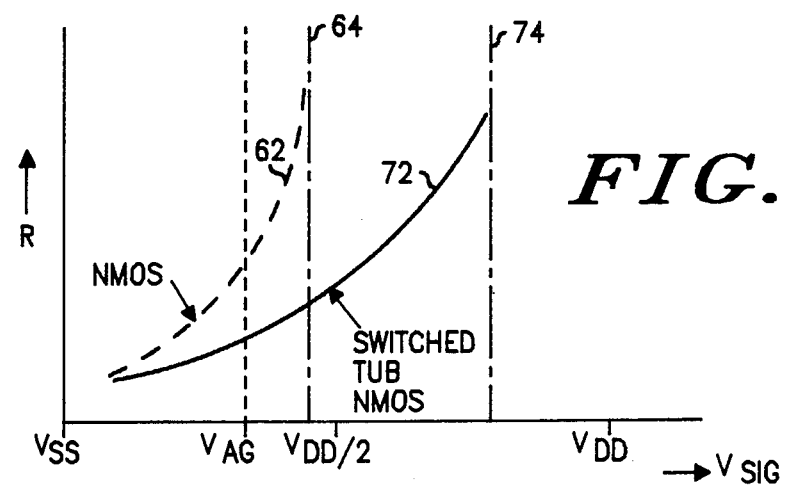
FIG. 4C is a graphic representation illustrating the change in resistance characteristics of a switched tub NMOS switch over that of a standard single NMOS switch.

In the present invention, the analog ground voltage $V_{AG}$ furnished by voltage supply 190 (FIG. 5) is skewed downward below one-half of supply voltage $V_{DD}$. As FIG. 4C illustrates, if $V_{AG}$ is set to a voltage sufficiently lower than asymptote 64, then single N-channel transistors can readily be used for all type I switches (switches which have one side connected to analog ground or a virtual analog ground). In the preferred embodiment illustrated in FIG. 5, these are type I switches 140, 150, and 160. Furthermore, in the preferred embodiment using only N-channel devices, $V_{SS} = 0_{VDC}$, $V_{DD} = +5_{VDC}$, and $V_{AG} = V_{DD}/3 = 1.67$ volts. It should be understood that an equivalent implimentation utilizing P-channel devices would have $V_{DD} = 0_{VDC}$, $V_{SS} = -5_{VDC}$, and $V_{AG} = V_{SS}/3 = -1.67$ volts. Hence, in practicing this aspect of the invention, the analog ground voltage $V_{AG}$ would have a magnitude of less than one half of the magnitude of the supply voltage, and would be skewed closer to ground potential—the voltage that the switched tub is switched to when turned off.

To accommodate the lower analog ground voltage $V_{AG}$, and to maintain a wide dynamic signal range, the N-channel output drive device of op-amp 180 (FIG. 5) is made large relative to the bias current it must sink. In this way, the output driver will remain in saturation down to a very low drain-to-source voltage.

3. Switched Tub On the Input

The only switches that cannot be a single N-channel transistor are the type II switches attached to input node 102 or output node 186. During the signal swing, both sides of a switch connected to these nodes can reside at any voltage in the operating range of the circuit. Therefore, in FIG. 5, switch 110 must be a switched tub switch, which has an increased operating range. The P-tub or bulk (B) of N-channel switch 110 is connected to $V_{SS}$ by N-channel transistor 120 when transistor 110 is off, and the bulk is coupled to node 104 by N-channel transistor 130 when switch 110 is on. Because of the lower $V_{AG}$, the switched tub switch configuration can be constructed entirely of N-channel transistors as shown.

FIG. 4C illustrates the resistance characteristics of the switched tub NMOS switch 110. When clock signal $\phi_{2D}$ is low, switch 110 is off, switch 130 is off, and switch 120 is on. The P-tub of transistor 110 is then switched to ground. When clock signal $\phi_{2D}$ is high, transistors 110 and 130 turn on, while transistor 120 turns off. Transistor 130 switches the P-tub of 110 to the same potential as its drain, thereby eliminating the back-bias effect, and lowering the threshold of transistor 110. This switching of the tub moves asymptote 74 (the value of $V_{SIG}$ at which the resistance becomes infinite) higher, and accounts for the increased operating range curve 72 for a switched tub device shown in FIG. 4C.

Since one side of switch 140 is always connected to $V_{AG}$ in the steady state, a single N-channel transistor may be used as this input switch. If, however, very low offset voltages are critical for a particular application, switch 140 may also be a switched tub switch. In this manner, the impedance seen by capacitor 108 at node 104 is the same during the turnoff of switch 150 as is is during the turnoff of switch 160.

4. Delayed Clock Signals

Figure 6:
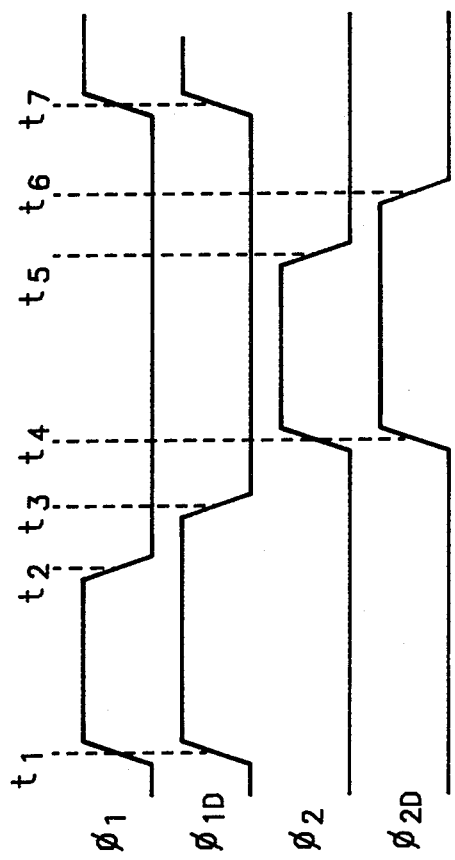
FIG. 6 is a timing diagram illustrating the relationship between the clock signals used to control the switches shown in FIG. 5.

FIG. 6 illustrates the timing diagrams of the clock signals utilized in FIG. 5. Since the charge injection of a switched tub switch at the input is significantly worse than that of the N-channel switches at the summing junction 182, the switched tub switch charge injection must be taken into account. If delayed clock signals $\phi_{ID}$ and $\phi_{2D}$ are utilized for the switches to the left of capacitor 108, then the switches to the right of capacitor 108 will already be open before the switches to the left of capacitor 108 turn off. Any charge injection caused by the switched tub switch will then be stored on the purely capacitive network formed by capacitor 108 and the parasitic capacitance on node 106, since there was no discharge path for node 106 when the switched tub switch turned off. This charge will be recovered when node 104 is again switched to a voltage source, and will not result in a net charge injection. Hence, by delaying the turnoff of the switches to the left of capacitor 108, their charge injection can be neglected.

The clock waveforms of FIG. 6 illustrate that at time $t_1$, clock signal $\phi_1$ and $\phi_{1D}$ go high, while clock signal $\phi_2$ and $\phi_{2D}$ remain low. During the time interval $t_1-t_2$, transistors 140 and 150 are turned on, while transistors 110 and 160 remain off. Note that since transistors 120 and 170 have their respective gates connected to $\bar{\phi}_{2D}$ (i.e., the inverse of $\phi_{2D}$), these transistors will also be on. The time interval $t_1-t_2$ represents the discharge cycle for capacitor 108.

At $t_2$, $\phi_1$ goes low, while $\phi_{1D}$ remains high. Accordingly, switch 150 turns off, and node 106 of capacitor 108 is floating. At $t_3$, $\phi_{1D}$ goes low to turn off transistor 140. However, any switch charge injection due to transistor 140 will not result in a net charge injection into the summing junction 182, since, as explained previously, node 106 is floating during the turnoff.

At $t_4$, $\phi_2$ and $\phi_{2D}$ go high. As a result, transistors 110 and 160 turn on, and the tub of transistor 110 is switched from $V_{SS}$ to the voltage at node 104 via transistors 120 and 130. The time interval $t_4-t_5$ represents the charging cycle of capacitor 108. At $t_5$, $\phi_2$ goes low such that switch 160 turns off. Again, note that node 106 is left floating such that when switched tub switch 110 turns off at $t_6$, no charge injection is seen at the summing junction. At $t_7$, $\phi_1$ and $\phi_{1D}$ go high to begin another cycle.

In the preferred embodiment of a switched capacitor filter having a 3dB cut off frequency of approximately 1 kHz, the capacitor charging/discharging time intervals $t_1-t_2$ and $t_4-t_5$ are approximately 5 microseconds, while the delayed time intervals $t_2-t_3$, $t_3-t_4$, $t_5-t_6$, and $t_6-t_7$ are approximately 100 nanoseconds. Clock signals $\phi_1$ and $\phi_2$ could be matched with respect to their rise and fall times by buffering the clock signals to transistors 150 and 160.

All MOS transistors shown in FIG. 5 are N-channel enhancement mode devices formed in an N-substrate with P-tubs. However, it will be understood that a corresponding improvement could be made by using P-channel devices formed in a P-type substrate having N-type tubs, and skewing $V_{AG}$ to a higher voltage than mid-supply.

If feedback capacitor 188 is present, a switched capacitor integrator circuit is formed. It will be understood, however, that numerous other switch capacitor circuit configurations may be formed utilizing the same concepts of the present invention. High pass filters, low pass filters, band pass filters, differentiator circuits, comparator circuits, and other gain stage circuits may advantageously utilize the switched capacitor circuit configuration of the present invention.

For example, the auto-zeroed gain stage shown in FIG. 2 can be constructed in accordance with the present invention as follows. First, any switch coupled to the summing junction, such as switch 25, should be a single N-channel device. Second, any switches coupled to the input signal $V_{IN}$ or the output signal $V_{OUT}$ which do not have one side connected to $V_{AG}$ or the summing junction, should be switched tub switches. Thus, in FIG. 2, switches 21 and 24 should be switched tub switches. The remaining switches 22 and 23 may be single N-channel devices. Third, $V_{AG}$ should be skewed downward to less than half of the supply voltage. Fourth, the switches coupled to the left side of C1 and the right side of C2 (i.e., those switches not connected to the summing junction) should be controlled by a delayed version of their respective clock signals. In other words, switches 21 and 24 should be gated by $\phi_{1D}$, and switches 22 and 23 should be gated by $\phi_{2D}$.

It will be understood that the source and drain electrodes of all MOS transistors are interchangeable and that the conductivity type of all transistors may be reversed. It will also be understood by those skilled in the art that complementary (opposite phase) clock signals, shown in parenthesis in FIG. 5, may be used for an inverting switched capacitor configuration.

In sum, an improved switched capacitor circuit configuration has been disclosed which exhibits improved low voltage supply operation and improved charge injection cancellation performance. In the preferred embodiment of the switched capacitor integrator, the improvement is realized by the particular configuration of a switched tub switch on the input, and single N-channel devices at the summing junction. The analog ground $V_{AG}$ is skewed downward, and the clock signals are delayed to turn off the switches at the summing junction before the charge injection of the switched tub switch is realized.

While a specific embodiment of the present invention has been shown and described herein, further modifications and improvement may be made by those skilled in the art. All such modifications which retain the basic underlying principles disclosed and claimed herein are within the scope of this invention.

What is claimed is:

1. A switched capacitor circuit having an input node, an output node, and a reference node, said circuit comprising in combination:
   a capacitor having first and second plates;
   a gain device having an input port and an output port, said output port coupled to said circuit output node;
   first switch means responsive to a first control signal for coupling said input node to said capacitor first plate, said first switch means being a switched-tub MOS transistor;
   second switch means responsive to a second control signal for coupling said capacitor first plate to said reference node;
   third switch means responsive to a third control signal for coupling said capacitor second plate to said reference node;
   fourth switch means responsive to a fourth control signal for coupling said capacitor second plate to said gain device input port, said third and fourth switch means being single MOS transistors of the same conductivity type; and
   clock means for providing said control signals to each of said switch means, said first and second control signals being delayed in time with respect to said third and fourth control signals such that the opening of each of said switch means coupled to said capacitor second plate occurs before the opening of each corresponding switch means not coupled thereto, whereby switching said first switch means does not produce charge injection into said gain device input port.

2. The switched capacitor circuit according to claim 1, further comprising a supply node having a voltage applied thereto, and means for providing a reference voltage to said reference node, the magnitude of said reference voltage being less than one-half of the magnitude of the voltage at said supply node.

3. The switched capacitor circuit according to claim 2, wherein the magnitude of said reference voltage is approximately equal to one-third of the magnitude of the voltage at said supply node.

4. The switched capacitor circuit according to claim 1, wherein said second, third, and fourth switch means are single N-channel MOS transistors.

5. The switched capacitor circuit according to claim 1, wherein said control signals provided by said clock means for said third and fourth switch means exhibit matched fall times.

6. A switched capacitor circuit having an input node, an output node, and a reference node, said circuit comprising in combination:

a first capacitor having first and second plates;

a second capacitor having first and second plates;

a gain device having an input port and an output port, said input port coupled to said first capacitor second plate and said second capacitor first plate, said output port coupled to said circuit output node;

first switch means responsive to a first control signal for coupling said input node to said first capacitor first plate, said first switch means being a switched-tub MOS transistor;

second switch means responsive to a second control signal for coupling said first capacitor first plate to said reference node;

third switch means responsive to a third control signal for coupling said second capacitor second plate to said reference node;

fourth switch means responsive to a fourth control signal for coupling said second capacitor second plate to said gain device output port, said fourth switch means being a switched-tub MOS transistor;

fifth switch means responsive to a fifth control signal for coupling said gain device input port to said gain device output port, said fifth switch means being a single MOS transistor; and clock means for providing said control signals to each of said switch means, said first, second, third, and fourth control signals being delayed in time with respect to said fifth control signal such that the opening of each of said switch means coupled to said gain device input port occurs before the opening of each corresponding switch means not coupled thereto, whereby switching said first and fourth switch means does not produce charge injection into said gain device input port.

7. The switched capacitor circuit according to claim 6, further comprising a supply node having a voltage applied thereto, and means for providing a reference voltage to said reference node, the magnitude of said reference voltage being less than one-half of the magnitude of the voltage at said supply node.

8. The switched capacitor circuit according to claim 7, wherein the magnitude of said reference voltage is approximately equal to one-third of the magnitude of the voltage at said supply node.

9. The switched capacitor circuit according to claim 1, wherein said second, third, and fifth switch means are single channel MOS transistors.

* * * * *